(12) United States Patent  
Lin et al.

(10) Patent No.: US 12,513,918 B2  
(45) Date of Patent: Dec. 30, 2025

(54) SEMICONDUCTOR DEVICE WITH IMPROVED MATCHING CHARACTERISTICS OF POLYSILICON RESISTIVE STRUCTURES

(71) Applicant: MEDIATEK INC., Hsinchu (TW)

(72) Inventors: Cheng-Hua Lin, Hsinchu (TW); Ching-Han Jan, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 698 days.

(21) Appl. No.: 17/811,326

(22) Filed: Jul. 8, 2022

(65) Prior Publication Data

US 2023/0038119 A1    Feb. 9, 2023

Related U.S. Application Data

(60) Provisional application No. 63/228,679, filed on Aug. 3, 2021.

(51) Int. Cl.  
*H10D 1/47* (2025.01)

(52) U.S. Cl.  
CPC .................................. *H10D 1/474* (2025.01)

(58) Field of Classification Search  
CPC ................................ H10D 1/47; H10D 1/474  
See application file for complete search history.

(56) References Cited

U.S. PATENT DOCUMENTS

| | | | | |
|---|---|---|---|---|
| 5,424,239 A * | 6/1995 | Sweeney | ................ | H10D 1/47 438/658 |
| 7,241,663 B2 * | 7/2007 | Howard | ................... | H10D 1/47 257/E27.047 |
| 8,154,104 B2 * | 4/2012 | Shin | ..................... | H10D 84/811 257/536 |
| 8,350,337 B2 * | 1/2013 | Tseng | ..................... | H10D 1/47 257/E21.616 |
| 8,482,100 B2 * | 7/2013 | Cho | ..................... | H10D 84/209 257/E27.047 |
| 8,779,526 B2 * | 7/2014 | Hsu | ..................... | H10D 84/811 438/238 |
| 8,823,112 B2 * | 9/2014 | Shinohara | ............ | H10D 84/811 257/E21.409 |

(Continued)

OTHER PUBLICATIONS

Chinese language office action dated Mar. 29, 2023, issued in application No. TW 111127931.

*Primary Examiner* — Zandra V Smith  
*Assistant Examiner* — Rohit Parthasarathy  
(74) *Attorney, Agent, or Firm* — McClure, Qualey & Rodack, LLP

(57) ABSTRACT

A semiconductor device is provided. The semiconductor device includes a semiconductor substrate, a polysilicon resistive structure, dummy polysilicon resistive structures, and a polysilicon ring structure. The semiconductor substrate has an active region and a passive region adjacent to the active region. The polysilicon resistive structure is disposed on an isolation structure in the passive region. The dummy polysilicon resistive structures are disposed on the isolation structure, respectively disposed outside opposite sides of the polysilicon resistive structure. The polysilicon ring structure is disposed on the isolation structure, encircling the polysilicon resistive structure and the dummy polysilicon resistive structures.

25 Claims, 8 Drawing Sheets

(56) References Cited

U.S. PATENT DOCUMENTS

| | | | | |
|---|---|---|---|---|
| 8,847,347 B2* | 9/2014 | Wessels | ............... | H10D 62/115 |
| | | | | 438/424 |
| 10,964,689 B2* | 3/2021 | Lu | ........................ | H10D 64/017 |
| 2005/0227440 A1* | 10/2005 | Ema | ..................... | H10D 84/811 |
| | | | | 257/E21.639 |
| 2007/0026628 A1* | 2/2007 | Chung | .................. | H10D 89/00 |
| | | | | 257/E21.628 |
| 2009/0179271 A1* | 7/2009 | Li | ....................... | H10D 89/819 |
| | | | | 438/129 |
| 2010/0109775 A1* | 5/2010 | Kamakura | ............... | H10D 1/47 |
| | | | | 338/308 |
| 2010/0112764 A1* | 5/2010 | Mehrotra | ............. | H10D 84/811 |
| | | | | 438/210 |
| 2010/0295133 A1* | 11/2010 | Kim | ........................ | H10D 1/47 |
| | | | | 257/E27.071 |
| 2010/0308436 A1* | 12/2010 | Nanjo | .................. | H10D 84/209 |
| | | | | 257/536 |
| 2010/0320544 A1* | 12/2010 | Tseng | ...................... | H10D 1/47 |
| | | | | 257/E21.598 |
| 2012/0083094 A1* | 4/2012 | Jensen | ............. | H01L 21/31053 |
| | | | | 257/E21.546 |
| 2012/0270379 A1* | 10/2012 | Lai | ...................... | H10D 84/038 |
| | | | | 257/E21.54 |
| 2013/0228878 A1* | 9/2013 | Wang | ..................... | H10D 64/68 |
| | | | | 257/410 |
| 2015/0187757 A1* | 7/2015 | Chung | ............. | H01L 21/76224 |
| | | | | 257/380 |
| 2015/0303117 A1* | 10/2015 | Zhu | ...................... | H10D 64/017 |
| | | | | 438/303 |
| 2016/0056227 A1* | 2/2016 | Heinrich-Barna | ..... | H10D 1/025 |
| | | | | 257/506 |
| 2018/0240794 A1* | 8/2018 | Ji | ......................... | H01L 23/528 |
| 2018/0269270 A1* | 9/2018 | Hasegawa | ............... | H10D 1/47 |
| 2021/0057338 A1* | 2/2021 | Itomi | ................... | H01L 23/552 |
| 2022/0238631 A1* | 7/2022 | Zierak | .............. | H01L 21/76283 |
| 2022/0399434 A1* | 12/2022 | Pan | .................. | H01L 21/32155 |

* cited by examiner

SEMICONDUCTOR DEVICE WITH IMPROVED MATCHING CHARACTERISTICS OF POLYSILICON RESISTIVE STRUCTURES

CROSS REFERENCE TO RELATED APPLICATIONS

This application claims the benefit of U.S. Provisional Application No. 63/228,679, filed on Aug. 3, 2021, the entirety of which is incorporated by reference herein.

BACKGROUND OF THE INVENTION

Field of the Invention

The present invention relates to a semiconductor device, and, in particular, to a semiconductor device with improved matching characteristic of polysilicon resistive structures.

Description of the Related Art

Integrated circuits are manufactured to include active devices such as diodes and transistors, and passive devices such as capacitors and resistive inductors. These active and passive devices are formed on a semiconductor substrate such as a silicon wafer, and are then interconnected in the desired manner.

Polysilicon resistors are typically used in such semiconductor applications as digital and analog circuits, analog-to-digital (ADC) converters, digital-to-analog (DAC) converters, RC oscillators, RF post drivers, and complimentary metal-oxide semiconductor devices. However, there are multiple steps in the fabrication processes, including the steps of photolithography, patterning, and implantation processes, where the resistance matching performance of the polysilicon resistors may suffer.

Thus, a novel semiconductor device is desirable to improve the matching characteristics of polysilicon resistors.

BRIEF SUMMARY OF THE INVENTION

An embodiment of the present invention provides a semiconductor device. The semiconductor device comprises a semiconductor substrate, a polysilicon resistive structure, dummy polysilicon resistive structures and a polysilicon ring structure. The semiconductor substrate has an active region and a passive region adjacent to the active region. The polysilicon resistive structure is disposed on an isolation structure in the passive region. The dummy polysilicon resistive structures are disposed on the isolation structure, respectively disposed outside opposite sides of the polysilicon resistive structure. The polysilicon ring structure is disposed on the isolation structure, encircling the polysilicon resistive structure and the dummy polysilicon resistive structures.

An embodiment of the present invention provides a semiconductor device. The semiconductor device comprises a semiconductor substrate, a polysilicon resistive structure, dummy polysilicon resistive structures and a polysilicon ring structure. The semiconductor substrate has an active region and a passive region surrounded by the active region. The polysilicon resistive structure is disposed on an isolation structure in the passive region, extending in a first direction. The dummy polysilicon resistive structures are arranged along a second direction on the isolation structure and extending in the first direction. The polysilicon ring structure is disposed on the isolation structure, surrounding the polysilicon resistive structure, wherein the dummy polysilicon resistive structures are disposed between the polysilicon resistive structure and the polysilicon ring structure along the second direction.

In addition, an embodiment of the present invention provides a semiconductor device. The semiconductor device comprises a semiconductor substrate, dummy polysilicon resistive structures, a polysilicon resistive structure and a polysilicon ring structure. The semiconductor substrate has an active region and a passive region. The passive region is adjacent to the active region. The dummy polysilicon resistive structures are disposed on an isolation structure in the passive region. The polysilicon resistive structure is disposed on the isolation structure, sandwiched between the dummy polysilicon resistive structures along a widthwise direction of the polysilicon resistive structure. The polysilicon ring structure is disposed on the isolation structure, encircling the polysilicon resistive structure, wherein the dummy polysilicon resistive structures are disposed between the polysilicon ring structure and the polysilicon resistive structure along the widthwise direction of the polysilicon resistive structure.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
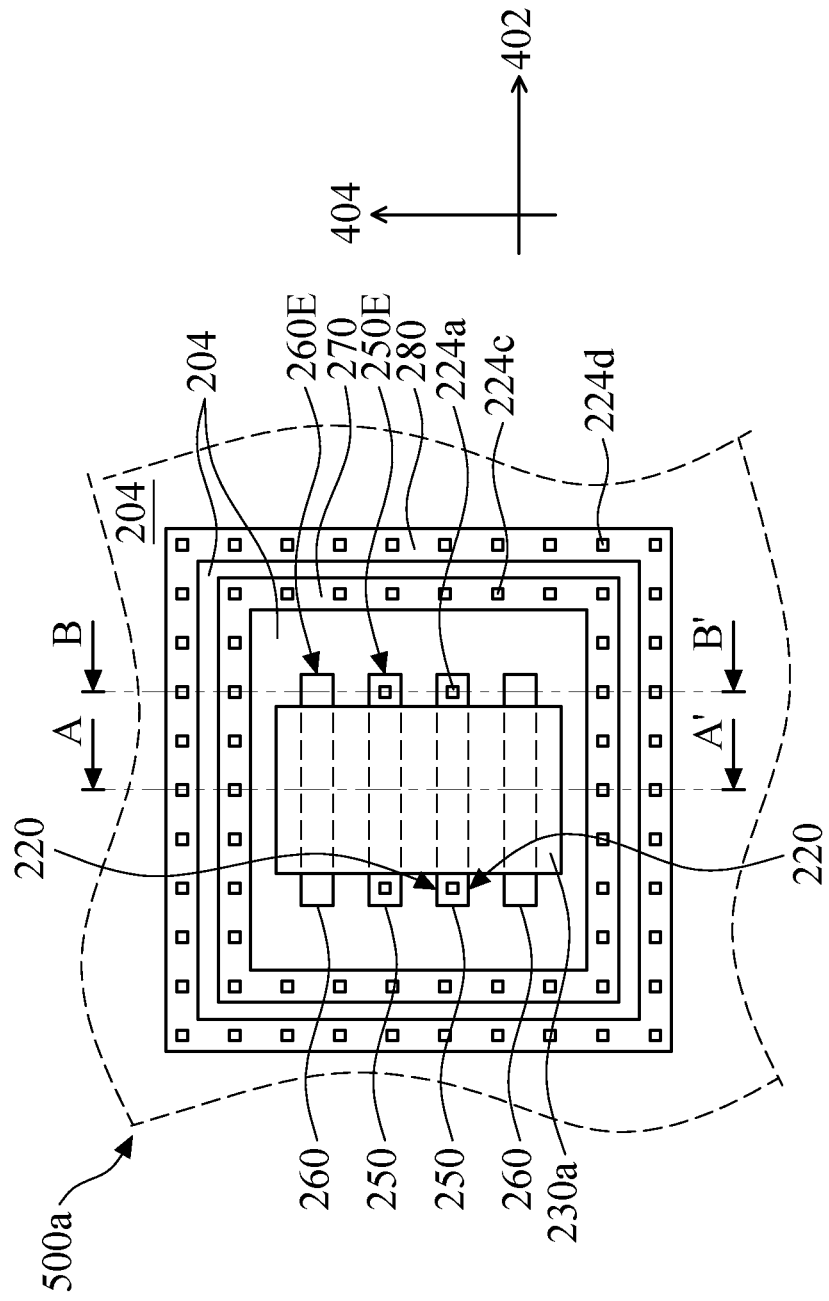
FIG. 1 illustrates a layout of a semiconductor device in accordance with some embodiments of the disclosure.

The following description is made for the purpose of illustrating the general principles in accordance with some embodiments of the disclosure and should not be taken in a limiting sense. The scope in accordance with some embodiments of the disclosure is best determined by reference to the appended claims.

The inventive concept is described fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments and may be implemented in various forms. Accordingly, the exemplary embodiments are provided only to disclose the inventive concept and let those skilled in the art know the category of the inventive concept. Also, the drawings as illustrated are only schematic and are non-limiting. In the drawings, the size of some of the elements may be exaggerated for illustrative purposes and not drawn to scale. The dimensions and the relative dimensions do not correspond to actual dimensions in the practice in accordance with some embodiments of the disclosure.

Embodiments provide a semiconductor device that includes polysilicon resistive structures with improved resistance matching characteristic achieved by arranging a polysilicon ring structure encircling the polysilicon resistive structures. During the development process of photoresist patterns for forming the polysilicon resistive structures and the polysilicon ring, the photoresist pattern for patterning the polysilicon ring structure can block mechanical and chemical attack form the flow of the developer, such that the photoresist pattern for forming the adjacent polysilicon resistive structures can be developed with substantially identical developing conditions. The resulting polysilicon resistive structures may have similar geometric size and shape, resulting in the predetermined resistance value. Therefore, the polysilicon resistive structures may have improved resistance matching performance.

Figure 2A:
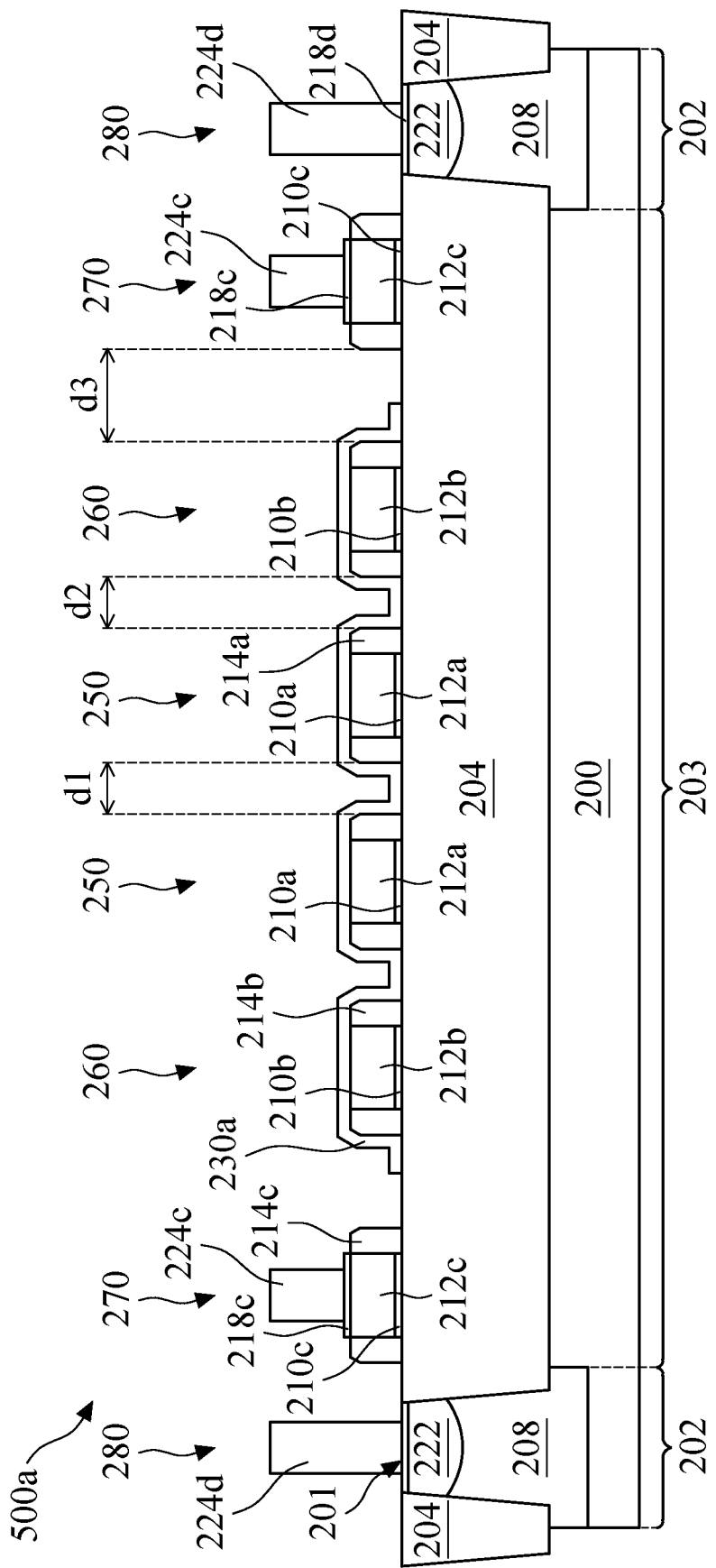
FIG. 2A illustrates a cross-sectional view of the semiconductor device shown along line A-A' in FIG. 1 in accordance with some embodiments.
Figure 2B:
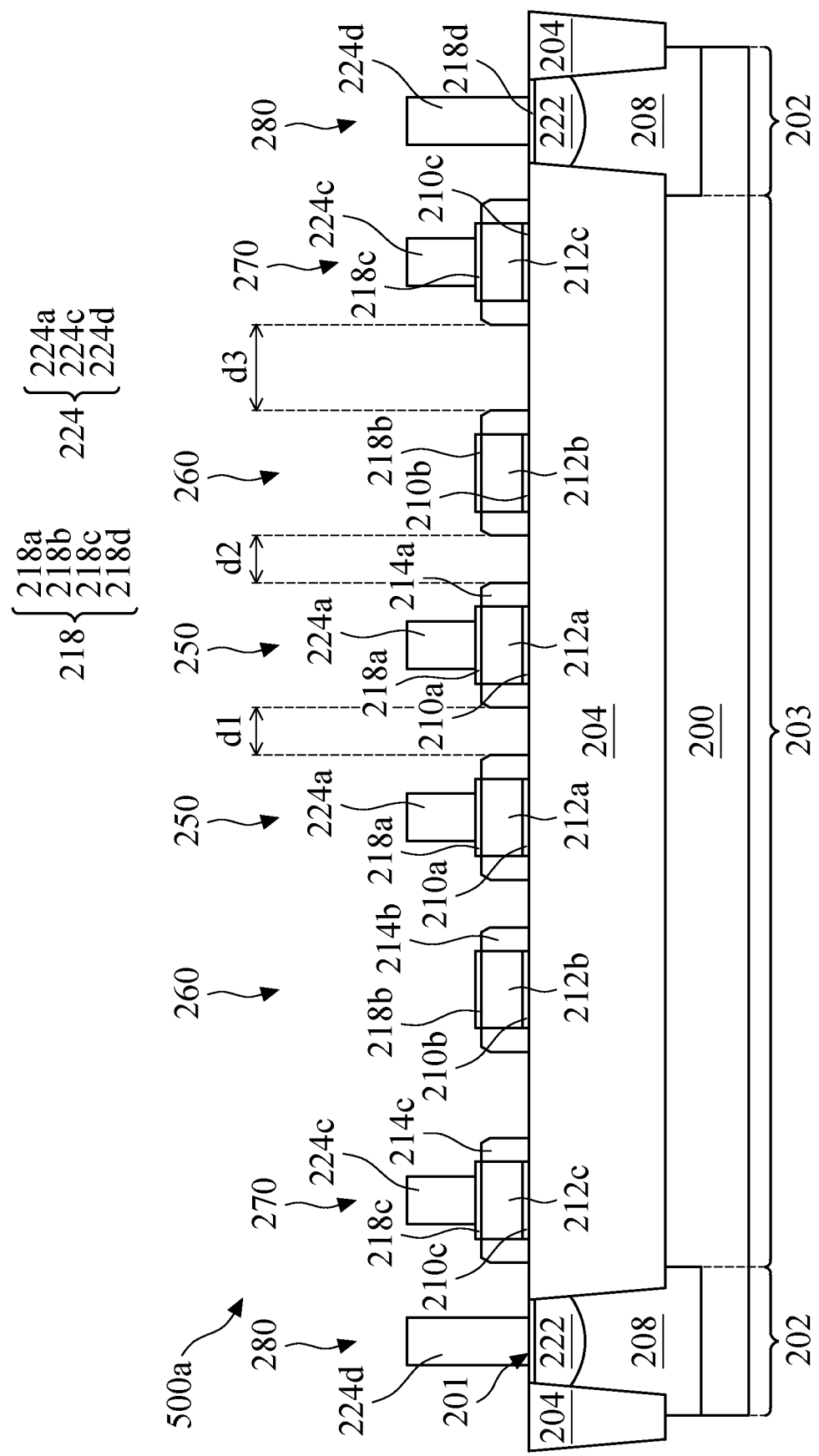
FIG. 2B illustrates a cross-sectional view of the semiconductor device shown along line B-B' in FIG. 1 in accordance with some embodiments.

FIG. 1 illustrates a layout of a semiconductor device 500a in accordance with some embodiments of the disclosure. FIG. 2A illustrates a cross-sectional view of the semiconductor device 500a shown along line A-A' in FIG. 1 in accordance with some embodiments. FIG. 2B illustrates a cross-sectional view of the semiconductor device 500a shown along line B-B' in FIG. 1 in accordance with some embodiments. For clearly showing the arrangements of a protection layer 230a, a polysilicon resistive structure 250, a dummy polysilicon resistive structure 260, and a polysilicon ring structure 270 of the semiconductor device 500a, salicide layers are not shown in FIG. 1. The semiconductor device 500a comprises a semiconductor substrate 200, the polysilicon resistive structures 250, the dummy polysilicon resistive structures 260 and the polysilicon ring structure 270 in accordance with some embodiments as shown in FIGS. 1, 2A and 2B. In some embodiments, the semiconductor substrate 200 may comprise silicon. In alternative embodiments, SiGe, bulk semiconductor, strained semiconductor, compound semiconductor, semiconductor-on-insulator (SOI), and other commonly used semiconductor substrates can be used for the semiconductor substrate 200. The semiconductor substrate 200 may have the desired conductivity type by implanting p-type or n-type impurities.

As shown in FIG. 1, the semiconductor substrate 200 has an active region 202 and a passive region 203 adjacent to the active region 202. In some embodiments, the active region 202 may be arranged to surround the passive region 203. In some embodiments, the active region 202 may provide for active electronic devices (not shown), such as field effect transistors (FETs), metal-oxide semiconductor field effect transistors (MOSFETs), complementary metal-oxide semiconductor transistors (CMOSs), bipolar transistors, high voltage transistors, high frequency transistors, memory cells, other suitable active devices, and/or combinations thereof, disposed therein.

As shown in FIG. 1, the active region 202 also provides for a guard ring structure 280 disposed therein. The guard ring structure 280 comprises a well region 208 and a doped region 222 disposed on the well region 208. The well region 208 and the doped region 222 of the guard ring structure 280 may be both electrically coupled to a ground terminal GND (not shown). In some embodiments, the well region 208 having a first conductive type is formed in the active region 202. The doped region 222 having the first conductive type is formed on the well region 208, adjacent to a top surface 201 of the semiconductor substrate 200. In some embodiments, a dopant concentration of the doped region 222 is larger than that of the well region 208. Therefore, if the well region 208 serves as an n-type well region 202, the doped region 222 would serve as an n-type heavily (n+) doped region 222. Alternatively, if the well region 208 serves as a p-type well region 202, the doped region 222 would serve as a p-type heavily (p+) doped region 222.

In some embodiments, the semiconductor substrate 200 may have the first conductive type, which is the same as the conductive type of the well region 208 and the doped region 222. For example, the semiconductor substrate 200 serves as a p-type semiconductor substrate 200, the well region 208 serves as a p-type well (PW) region 208, and the doped region 222 serves as a p-type heavily (p+) doped region 222.

In some embodiments, the semiconductor substrate 200 may have a second conductive type, which is the different from the conductive type of the well region 208 and the doped region 222. For example, the semiconductor substrate 200 serves as a p-type semiconductor substrate 200, the well region 208 serves as a n-type well (NW) region 208, and the doped region 222 serves as a n-type heavily (n+) doped region 222.

In some embodiments, the passive region 203 surrounded by the active region 202 may provide for passive microelectronic devices, such as resistors, capacitors, inductors, other suitable components, and/or combinations thereof, disposed therein. As shown in FIGS. 1, 2A and 2B, the passive region 203 may comprise an isolation structure 204 disposed therein. In addition, other isolation structures 204 may be disposed adjacent to the active region 202 (e.g. surrounding the active region 202) to define and electrically isolate the active region 202 from other active regions (not shown) of the semiconductor substrate 200. In some embodiments, the isolation structure 204 comprises a shallow trench isolation (STI) or local oxidation of silicon (LOCOS).

As shown in FIGS. 1, 2A and 2B, the polysilicon resistive structures 250 are disposed on the isolation structure 204 in the passive region 203 of the semiconductor substrate 200. In addition, the polysilicon resistive structures 250 are surrounded by the guard ring structure 280. The polysilicon resistive structures 250 may have a line shape, a strip shape, a rectangle shape, or another suitable shape, and it may extend in a first direction 402. Therefore, the first direction 402 may also serve as the lengthwise direction of the polysilicon resistive structure 250. Also, the polysilicon resistive structures 250 may be periodically arranged along a second direction 404 that is a different direction than the first direction 402. For example, the second direction 404 may be substantially vertical to the first direction 402. Therefore, the second direction 404 may also serve as the widthwise direction of the polysilicon resistive structure 250. The polysilicon resistive structures 250 may be arranged parallel to each other. In addition, the adjacent polysilicon resistive structures 250 may be spaced a distance d1 apart from each other. The distance d1 may be greater than or equal to the minimum spacing between adjacent polysilicon layers according to the design rule. In other embodiments, the number of the polysilicon resistive structures 250 is not limited. A single polysilicon resistive structure 250 may be disposed on the isolation structure 204.

In some embodiments, as shown in FIGS. 2A and 2B, the polysilicon resistive structure 250 may be a single-component structure or a multi-component structure. In some embodiments, the polysilicon resistive structure 250 may include a dielectric layer 210a, a polysilicon layer 212a, and spacers 214a. As shown in FIGS. 2A and 2B, the dielectric layer 210a is disposed on the isolation structure 204. The dielectric layer 210a may be a single layer or multiple layers formed of any suitable dielectric material, any suitable high-K dielectric material, and/or combinations thereof. The polysilicon layer 212a is disposed over the dielectric layer 210a. In some embodiments, the polysilicon layer 212a may be a single layer or multiple layers, and it may be doped with n-type or p-type impurities. The spacers 214a are positioned on opposite sides of the polysilicon layer 212a and opposite sides of the dielectric layer 210a. In some embodiments, the spacer 214a may comprise a dielectric material such as silicon nitride, silicon oxide, silicon carbide, silicon oxynitride, other suitable materials, or combinations thereof. In some embodiments, the polysilicon resistive structure 250 may be electrically coupled to a power supply terminal (not shown).

As shown in FIGS. 1, 2A, and 2B, the dummy polysilicon resistive structures 260 are disposed on the isolation structure 204 in the passive region 203 of the semiconductor substrate 200. In some embodiments, the dummy polysilicon resistive structures 260 are respectively disposed outside opposite sides 220 of the polysilicon resistive structure 250. Therefore, at least one pair of dummy polysilicon resistive structures 260 may be disposed adjacent to the opposite sides 220 of the polysilicon resistive structure 250. In addition, the dummy polysilicon resistive structures 260 and the polysilicon resistive structure 250 may have similar arrangements. For example, the dummy polysilicon resistive structures 260 may be arranged along the second direction 404 on the isolation structure 204 and extending in the first direction 402. The polysilicon resistive structure 250 may be disposed sandwiched between the dummy polysilicon resistive structures 260 along the widthwise direction of the polysilicon resistive structure 250 (i.e. the second direction 404). In some embodiments, the dummy polysilicon resistive structures 260 adjacent to the opposite sides 220 of the polysilicon resistive structure 250 may be parallel to the polysilicon resistive structure 250. In some embodiments, the polysilicon resistive structure 250 and the dummy polysilicon resistive structures 260 may have same shapes and sizes in a top view as shown in FIG. 1. For example, the dummy polysilicon resistive structures 260 may have a line shape, a strip shape, a rectangle shape, or another suitable shape, and it may extend in the first direction 402. In some embodiments, the dummy polysilicon resistive structure 260 is separated from the adjacent polysilicon resistive structure 250 by a distance d2 along the second direction 404 (i.e. the widthwise direction of the polysilicon resistive structure 250). The distance d2 may be greater than or equal to the distance d1 between the adjacent polysilicon resistive structures 250 in the second direction 404.

In some embodiments, as shown in FIGS. 2A and 2B, the dummy polysilicon resistive structure 260 and the polysilicon resistive structure 250 may comprise similar structures and may be formed simultaneously. In addition, the dummy polysilicon resistive structure 260 may be a single-component structure or a multi-component structure. In some embodiments, the dummy polysilicon resistive structure 260 may include a dielectric layer 210b, a polysilicon layer 212b, and spacers 214b. As shown in FIGS. 2A and 2B, the dielectric layer 210b is disposed on the isolation structure 204. The dielectric layer 210b may be a single layer or multiple layers formed of any suitable dielectric material, any suitable high-K dielectric material, and/or combinations thereof. The polysilicon layer 212b is disposed over the dielectric layer 210b. In some embodiments, the polysilicon layer 212b may be a single layer or multiple layers. In some embodiments, the polysilicon layer 212b may be doped with n-type or p-type impurities or un-doped. The spacers 214b are positioned on opposite sides of the polysilicon layer 212b and opposite sides of the dielectric layer 210b. In some embodiments, the spacer 214b may comprise a dielectric material such as silicon nitride, silicon oxide, silicon carbide, silicon oxynitride, other suitable materials, or combinations thereof. In some embodiments, the dummy polysilicon resistive structures 260 are electrically floating.

As shown in FIGS. 1, 2A and 2B, in some embodiments, the polysilicon ring structure 270 is disposed on the isolation structure 204, encircling the polysilicon resistive structure 250 and a pair of the dummy polysilicon resistive structures 260. In some embodiments, the polysilicon ring structure 270 is formed as a continuous ring structure surrounding the polysilicon resistive structure 250 and the dummy polysilicon resistive structures 260, as shown in FIG. 1. In some embodiments, the dummy polysilicon resistive structure 260 is disposed between the polysilicon resistive structure 250 and the polysilicon ring structure 270 along the second direction 404 (i.e. the widthwise direction of the polysilicon resistive structure 250). In addition, the dummy polysilicon resistive structures 260 may not be disposed between the polysilicon ring structure 270 and the polysilicon resistive structure 250 along the first direction 402 (i.e. the lengthwise direction of the polysilicon resistive structure 250).

In some embodiments, the polysilicon ring structure 250 is separated from the adjacent dummy polysilicon resistive structure 260 by a distance d3 along the second direction 404 (i.e. the widthwise direction of the polysilicon resistive structure 250). In some embodiments, the distance d3 may be greater than or equal to the distance d1 between the adjacent polysilicon resistive structures 250 along the second direction 404. In some embodiments, the distance d3 may be greater than or equal to the distance d2 between the adjacent polysilicon resistive structures 250 and the dummy polysilicon resistive structure 260 along the second direction 404.

As shown in FIGS. 1, 2A and 2B, the guard ring structure 280 disposed in the active region 202 may encircle the polysilicon ring structure 250, the dummy polysilicon resistive structures 260 and the polysilicon ring structure 270. In other words, the polysilicon ring structure 270 is disposed between the polysilicon resistive structure 250 and the guard ring structure 280. In some embodiments, the polysilicon ring structure 270 and the guard ring structure 280 have the same shape. For example, from the top view (as shown in FIG. 1), they may have a rectangular ring shape, or another suitable shape. Therefore, the guard ring structure 280 is parallel to the polysilicon ring structure 270 in the top view shown in FIG. 1.

In some embodiments, the polysilicon ring structure 270, the polysilicon resistive structure 250, and the dummy polysilicon resistive structure 260 may comprise similar structures and may be formed simultaneously, as shown in FIGS. 2A and 2B. In addition, the polysilicon ring structure 270 may be a single-component structure or a multi-component structure. In some embodiments, the polysilicon ring structure 270 may include a dielectric layer 210c, a polysilicon layer 212c, and spacers 214c. As shown in FIGS. 2A and 2B, the dielectric layer 210c is disposed on the isolation structure 204. The dielectric layer 210c may be a single layer or multiple layers formed of any suitable dielectric material, any suitable high-K dielectric material, and/or combinations thereof. The polysilicon layer 212c is disposed over the dielectric layer 210c. In some embodiments, the polysilicon layer 212c may be a single layer or multiple layers. In some embodiments, the polysilicon layer 212c may be doped with n-type or p-type impurities or un-doped. The spacers 214c are positioned on opposite sides of the polysilicon layer 212c and opposite sides of the dielectric layer 210a. In some embodiments, the spacer 214c may comprise a dielectric material such as silicon nitride, silicon oxide, silicon carbide, silicon oxynitride, other suitable materials, or combinations thereof. The polysilicon ring structure 260 may be electrically coupled to a power supply terminal (not shown) in accordance with some embodiments as shown in FIGS. 1, 2A and 2B.

In some embodiments, the semiconductor device 500a further comprises a protection layer 230a disposed on the polysilicon resistive structure 250 and the dummy polysilicon resistive structures 260, as shown in FIGS. 1, 2A and 2B. In this embodiment, the protection layer 230a is formed without covering the polysilicon ring structure 270. In other words, the polysilicon ring structure 270 is disposed without covered by the protection layer 230a, such that the polysilicon ring structure 270 is exposed to a subsequent salicide process. As shown in FIGS. 1, and 2B, the protection layer 230a may partially cover the polysilicon resistive structure 250 and the dummy polysilicon resistive structures 260, such that end portions (terminals) 250E of the polysilicon resistive structure 250 and end portions 260E of the dummy polysilicon resistive structures 260 are exposed to a subsequent salicide process. In other embodiments, the protection layer 230a may not cover the dummy polysilicon resistive structures 260. In some embodiments, the protection layer 230a may prevent a salicide layer from forming on the polysilicon resistive structure 250. Therefore, the polysilicon resistive structure 250 covered by the protection layer 230a thereon may provide increased resistivity. In some embodiments, the protection layer 230a may comprise any suitable material. The protection layer 230a may comprise a resist protection oxide (RPO), such as an oxide layer, a nitride layer, an oxy-nitride layer, other suitable layers, and/or combinations thereof.

In some embodiments, the semiconductor device 500a further comprises salicide layers 218 covering the polysilicon resistive structure 250, the dummy polysilicon resistive structures 260 and the polysilicon ring structure 270 exposed from the protection layer 230a, as shown in FIGS. 1, 2A and 2B. In addition, the salicide layers 218 may cover the top surface 201 of the semiconductor substrate 200 in the guard ring structure 280 exposed from the protection layer 230a. More specifically, the salicide layers 218 may comprises salicide layers 218a, 218b, 218c and 218d. The salicide layers 218a partially cover the polysilicon resistive structure 250, for example, the salicide layers 218a cover the end portions of the polysilicon layer 212a of the polysilicon resistive structure 250, as shown in FIG. 2B. In addition, the salicide layers 218b partially cover the dummy polysilicon resistive structures 260, for example, the salicide layers 218b cover the end portions of the polysilicon layers 212b of the dummy polysilicon resistive structures 260, as shown in FIG. 2B. Further, the salicide layer 218c fully covers the polysilicon layers 212c of the polysilicon ring structure 270, as shown in FIGS. 2A and 2B. Moreover, the salicide layer 218d covers the top surface 201 of the semiconductor substrate 200 in the guard ring structure 280, as shown in FIGS. 2A and 2B. In some embodiments, the protection layer 230a covering the central portions of the polysilicon resistive structure 250 and the dummy polysilicon resistive structures 260 is adjacent to the salicide layers 218a and 218b.

In some embodiments, the semiconductor device 500a further comprises conductive interconnect structure 224 disposed on the salicide layer 218, as shown in FIGS. 1, 2A and 2B. In some embodiments, the conductive interconnect structures 224 comprise conductive interconnect structures 224a, 224c and 224d. More specifically, the conductive interconnect structures 224a are disposed on the salicide layers 218a and electrically coupled to the polysilicon resistive structure 250. In addition, the conductive interconnect structures 224c are disposed on the salicide layer 218c and electrically coupled to the polysilicon ring structure 270. Further, the conductive interconnect structures 224d are disposed on the salicide layer 218d and electrically coupled to the guard ring structure 280. Therefore, the polysilicon resistive structure 250 and the polysilicon ring structure 270 may be electrically coupled to the power supply terminals (not shown) by the corresponding salicide layers 218 and the conductive interconnect structures 224. Since the dummy polysilicon resistive structures 260 are electrically floating, the conductive interconnect structures 224 are not required to be disposed on the dummy polysilicon resistive structures 260. In some embodiments, the conductive interconnect structures 224 comprises contacts, vias and metal lines formed over the semiconductor substrate 200. In some embodiments, the semiconductor device 500a is fabricated without forming the conductive interconnect structures 224c on the polysilicon ring structure 270. The polysilicon ring structure 270 may be electrically floating.

Figure 3:
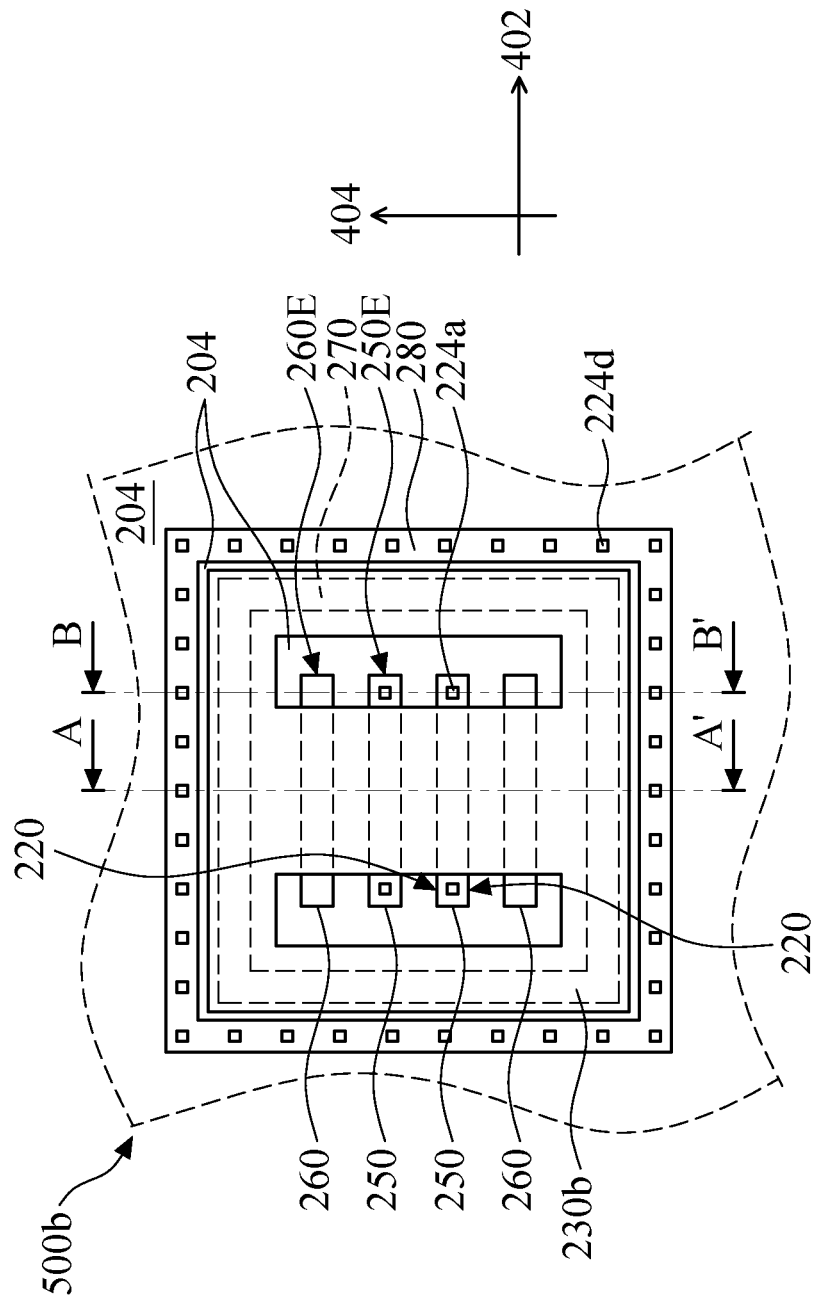
FIG. 3 illustrates a layout of a semiconductor device in accordance with some embodiments of the disclosure.
Figure 4A:
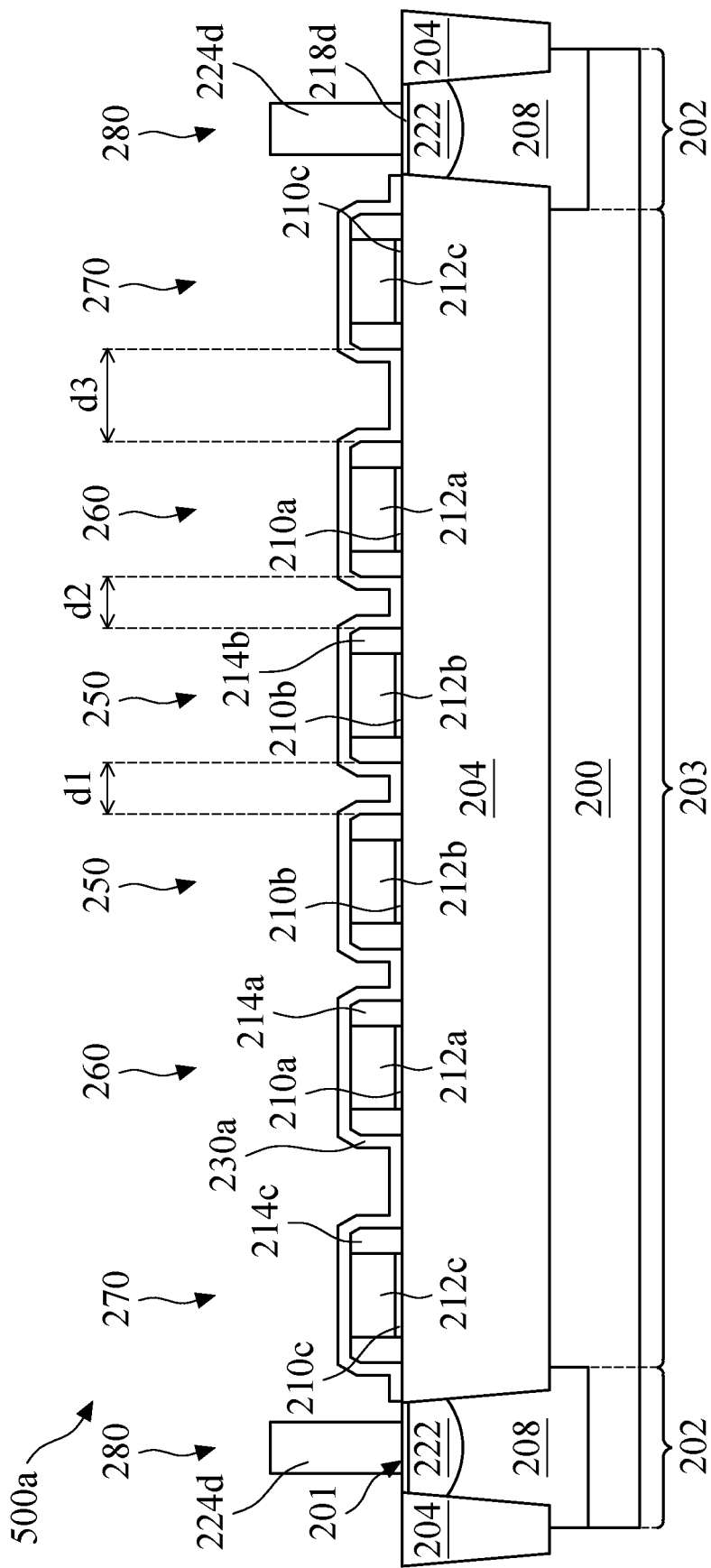
FIG. 4A illustrates a cross-sectional view of the semiconductor device shown along line A-A' in FIG. 3 in accordance with some embodiments.
Figure 4B:
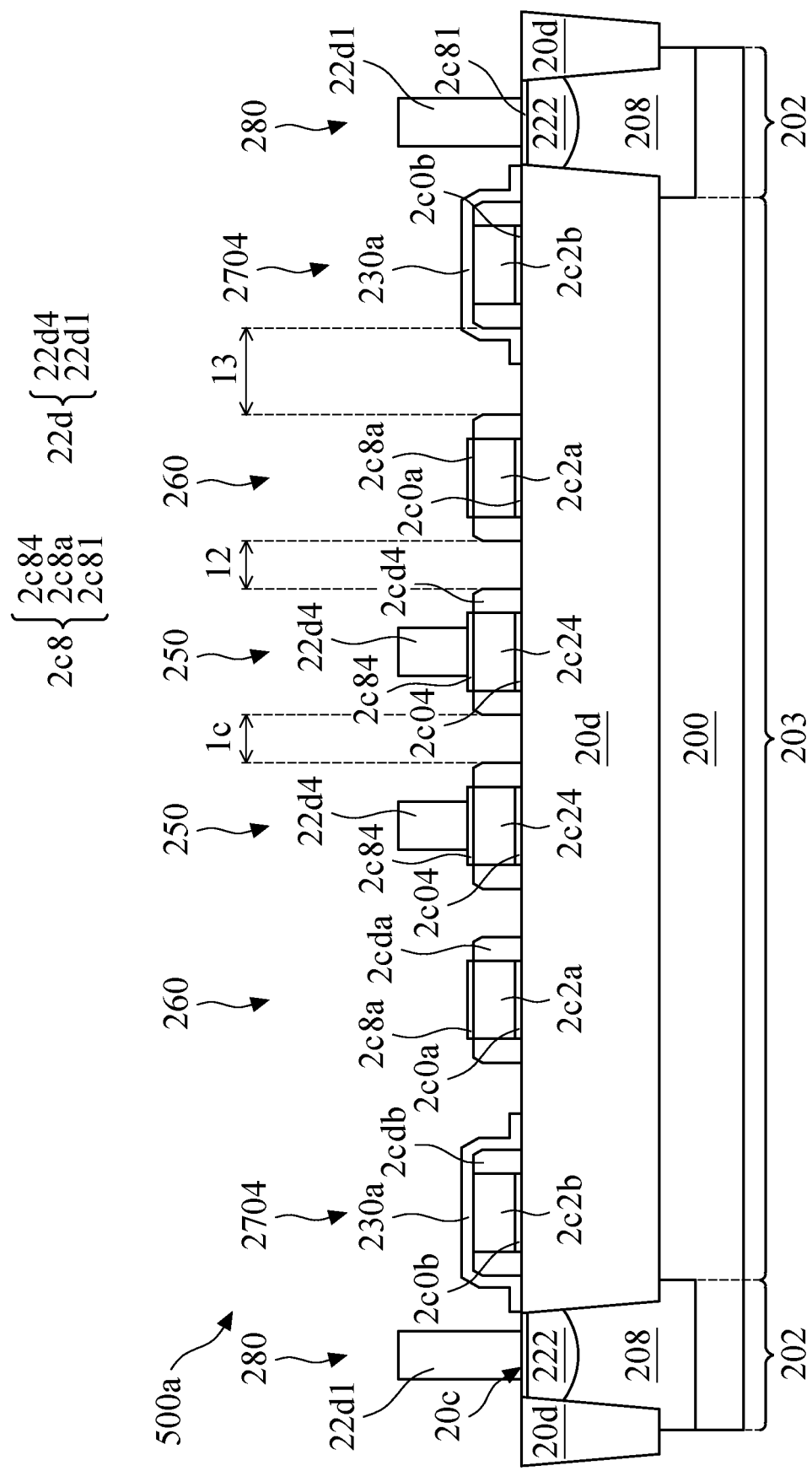
FIG. 4B illustrates a cross-sectional view of the semiconductor device shown along line B-B' in FIG. 3 in accordance with some embodiments.

FIG. 3 illustrates a layout of a semiconductor device 500b in accordance with some embodiments of the disclosure. FIG. 4A illustrates a cross-sectional view of the semiconductor device 500b shown along line A-A' in FIG. 3 in accordance with some embodiments. FIG. 4B illustrates a cross-sectional view of the semiconductor device 500b shown along line B-B' in FIG. 3 in accordance with some embodiments. For clearly showing the arrangements of a protection layer 230b, the polysilicon resistive structures 250, the dummy polysilicon resistive structure 260, and the polysilicon ring structure 270 of the semiconductor device 500b, salicide layers are not shown in FIG. 3. Elements of the embodiments hereinafter, that are the same or similar as those previously described with reference to FIGS. 1, 2A and 2B, are not repeated for brevity.

The difference between the semiconductor device 500a and the semiconductor package 500b is that the semiconductor device 500b includes a protection layer 230b partially covering the polysilicon resistive structure 250 and the dummy polysilicon resistive structures 260, and fully covering the polysilicon ring structure 270. Therefore, the subsequent formed salicide layers 218 covers the end portions 250E of the polysilicon resistive structure 250 and the end portions 260E of the dummy polysilicon resistive structures 260, without covering the polysilicon ring structure 270. In addition, the conductive interconnect structures 224 are not electrically coupled to the polysilicon ring structure 270. Since the salicide layers 218 and the conductive interconnect structures 224 are not formed over the polysilicon ring structure 270, the polysilicon ring structure 270 is electrically floating. In some embodiments, the semiconductor package 500b may provide another design choice for the polysilicon ring structure 270.

Figure 5:
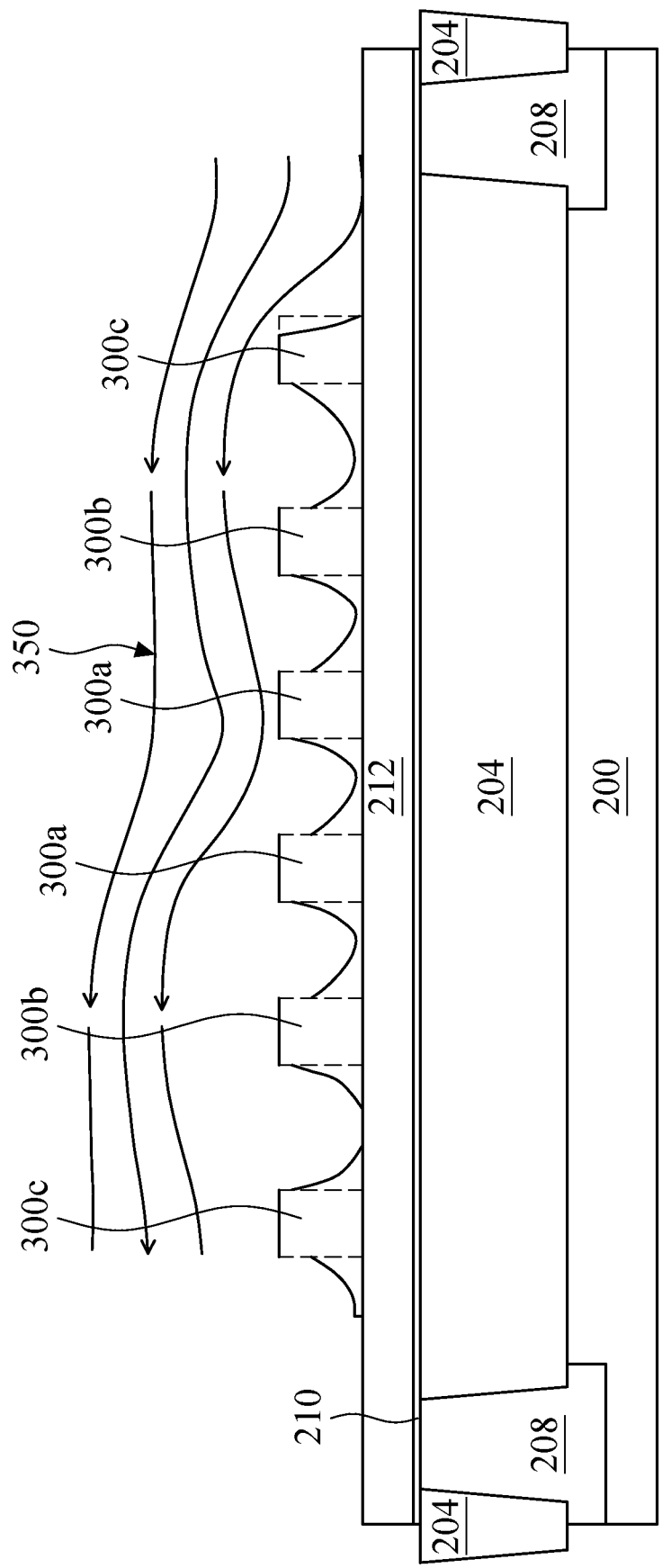
FIG. 5 illustrates a schematic view showing a flow of the developer and an exposed photoresist during a development process for patterning polysilicon resistive structures of a semiconductor device in accordance with some embodiments of the disclosure.

In some embodiments, the designed polysilicon ring structure 270 encircling the polysilicon resistive structures 250 of the semiconductor devices 500a and 500b may reduce the resistance-mismatching phenomenon of the adjacent polysilicon resistive structures by reducing the variability of the photoresist patterns for forming the polysilicon resistive structures 250. FIG. 5 illustrates a schematic view showing a flow of the developer and an exposed photoresist during a development process for patterning the polysilicon layers of the polysilicon resistive structures 250, the dummy polysilicon resistive structure 260 and the polysilicon ring structure 270 of the semiconductor devices 500a and 500b in accordance with some embodiments of the disclosure. The development process shown in FIG. 5 is used to developing photoresist patterns 300a, 300b and 300c (the predetermined sizes and positions of the photoresist patterns 300a, 300b and 300c are illustrated as dashed). The photoresist patterns 300a, 300b and 300c may use as masks for patterning a polysilicon layer 212 and a dielectric layer 210 to form the polysilicon layers 212a and the dielectric layer 210a of the polysilicon resistive structure 250, the polysilicon layer 212b and the dielectric layer 210b of the dummy polysilicon resistive structure 260 and the polysilicon layer 212c and the dielectric layer 210c of the polysilicon ring structure 270.

During the development process, the photoresist pattern 300c, which is used to form the polysilicon layer 212c and the dielectric layer 210c of the polysilicon ring structure 270 encircling the polysilicon resistive structures 250, is first directly exposed to a developer flow 350 to block mechanical and chemical attack from the developer flow 350, while the photoresist patterns 300a and 300b, which are used to form the polysilicon layers and the dielectric layers of the polysilicon resistive structures 250 and the dummy polysilicon resistive structure 260 surrounded by the polysilicon ring structure 270, are shadowed from the mechanical force from the developer flow 350. Therefore, the photoresist pattern 300c (the right one in FIG. 5) may be developed narrower than the photoresist patterns 300a and 300b, and the photoresist patterns 300a and 300b may have substantially identical size, as shown in FIG. 5. In addition, the variability between the adjacent photoresist patterns 300a may be further reduced. After the patterning process and the subsequent fabricating processes, the adjacent polysilicon resistive structures 250 may have substantially identical linewidth. The resistance variation between the adjacent polysilicon resistive structures 250 can be further eliminated. Therefore, the polysilicon resistive structures 250 of semiconductor devices 500a and 500b may have improved resistance matching characteristic.

Figure 6:
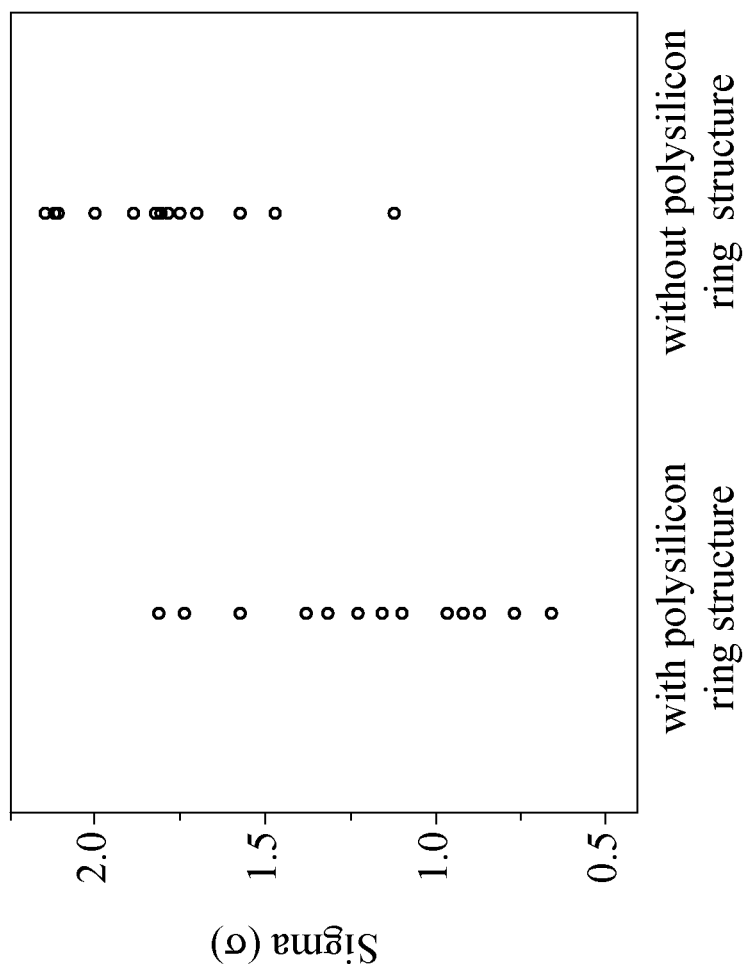
FIG. 6 illustrates a matching result comparison diagram between a polysilicon resistive structure of a semiconductor device in accordance with some embodiments of the disclosure and the conventional polysilicon resistive structures.

FIG. 6 illustrates a matching result comparison diagram between the polysilicon resistive structure 250 surrounded by the polysilicon ring structure 270 of the semiconductor devices 500a and 500b in accordance with some embodiments of the disclosure and the conventional polysilicon resistive structure without surrounded by the polysilicon ring structure 270. In some embodiments, the polysilicon resistive structure 250 and the conventional polysilicon resistive structure having a width of about 0.5 □m and a length of about 30 □m are choose for measurement of the resistance variation (sigma (σ)). As shown in FIG. 6, the polysilicon resistive structures 250 surrounded by the polysilicon ring structure 270 of the semiconductor devices 500a and 500b show the less resistance variation (sigma (σ)) than the conventional polysilicon resistive structures without surrounded by the polysilicon ring structure 270. Compared to the conventional polysilicon resistive structure without surrounded by the polysilicon ring structure, the polysilicon resistive structures 250 of the semiconductor devices 500a and 500b has improved resistance matching characteristic.

Embodiments provide the semiconductor devices 500a and 500b. The semiconductor devices 500a and 500b comprise the semiconductor substrate 200, the polysilicon resistive structure 250, the dummy polysilicon resistive structures 260 and the polysilicon ring structure 270. The semiconductor substrate 200 has an active region 202 and a passive region 203 adjacent to the active region 202. The polysilicon resistive structure 250 is disposed on the isolation structure 204 in the passive region 203. The dummy polysilicon resistive structures 260 are disposed on the isolation structure 204, respectively disposed outside opposite sides 220 of the polysilicon resistive structure 250. The polysilicon ring structure 270 is disposed on the isolation structure 204, encircling the polysilicon resistive structure 250 and the dummy polysilicon resistive structures 260. In some embodiments, the passive region 203 is surrounded by the active region 202. In some embodiments, the polysilicon resistive structure 250 is disposed in such a way that it extends in the first direction 402. In some embodiments, the dummy polysilicon resistive structures 260 are arranged along the second direction 404 on the isolation structure 204 and extending in the first direction 402. In some embodiments, the polysilicon resistive structure 250 is disposed sandwiched between the dummy polysilicon resistive structures 260 along the widthwise direction of the polysilicon resistive structure 205 (i.e. the second direction 404). In some embodiments, the dummy polysilicon resistive structures 260 are disposed between the polysilicon ring structure 270 and the polysilicon resistive structure 250 along the widthwise direction of the polysilicon resistive structure 250 (i.e. the second direction 404).

Embodiments provide the semiconductor device that includes the polysilicon ring structure encircling the polysilicon resistive structures, such that the polysilicon resistive structures have improved resistance matching characteristic. During the development process for patterning the polysilicon layers of the polysilicon resistive structures, the dummy polysilicon resistive structure and the polysilicon ring structure of the semiconductor device in accordance with some embodiments of the disclosure, the photoresist pattern used to form the polysilicon layer of the polysilicon ring structure encircling the polysilicon resistive structures is directly exposed to the developer flow to block mechanical and chemical attack from the developer flow, such that the resulting polysilicon resistive structures may have substantially identical linewidth. The resistance variation between the adjacent polysilicon resistive structures can be further eliminated. Therefore, the polysilicon resistive structures of semiconductor devices may have improved resistance matching characteristic.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising:
a semiconductor substrate having an active region and a passive region adjacent to the active region;
a polysilicon resistive structure disposed on an isolation structure in the passive region;
dummy polysilicon resistive structures on the isolation structure, respectively disposed outside opposite sides of the polysilicon resistive structure; and
a polysilicon ring structure disposed on the isolation structure, encircling the polysilicon resistive structure and the dummy polysilicon resistive structures, wherein the dummy polysilicon resistive structures are disposed adjacent to opposite sides of the polysilicon resistive structure, wherein the dummy polysilicon resistive structures are electrically floating.

2. The semiconductor device as claimed in claim 1, further comprising:
a guard ring structure disposed in the active region, encircling the polysilicon ring structure, the polysilicon resistive structure and the dummy polysilicon resistive structures.

3. The semiconductor device as claimed in claim 2, wherein the polysilicon ring structure and the guard ring structure have the same shape in a top view.

4. The semiconductor device as claimed in claim 2, wherein the polysilicon ring structure is disposed between the polysilicon resistive structure and the guard ring structure.

5. The semiconductor device as claimed in claim 1, wherein the polysilicon resistive structure and the dummy polysilicon resistive structures have the same shape in a top view.

6. The semiconductor device as claimed in claim 1, wherein the dummy polysilicon resistive structures are disposed between the polysilicon resistive structure and the polysilicon ring structure.

7. The semiconductor device as claimed in claim 1, wherein the polysilicon ring structure is electrically floating.

8. The semiconductor device as claimed in claim 1, wherein the polysilicon ring structure is un-doped.

9. The semiconductor device as claimed in claim 1, further comprising:
a protection layer disposed on the polysilicon resistive structure, without covering the polysilicon ring structure; and
salicide layers fully covering the polysilicon ring structure and partially covering the polysilicon resistive structure.

10. The semiconductor device as claimed in claim 1, further comprising:
a protection layer covering the polysilicon resistive structure and the polysilicon ring structure; and
salicide layers covering end portions of the polysilicon resistive structure, without covering the polysilicon ring structure.

11. A semiconductor device, comprising:
a semiconductor substrate having an active region and a passive region surrounded by the active region;
a polysilicon resistive structure disposed on an isolation structure in the passive region, extending in a first direction;
dummy polysilicon resistive structures arranged along a second direction on the isolation structure and extending in the first direction; and
a polysilicon ring structure disposed on the isolation structure, surrounding the polysilicon resistive structure, wherein the dummy polysilicon resistive structures are disposed between the polysilicon resistive structure and the polysilicon ring structure along the second direction, wherein the dummy polysilicon resistive structures are disposed adjacent to opposite sides of the polysilicon resistive structure, wherein the dummy polysilicon resistive structures are electrically floating.

12. The semiconductor device as claimed in claim 11, further comprising:
a first salicide layer partially covering the polysilicon resistive structure; and
a first conductive interconnect structure disposed on the first salicide layer.

13. The semiconductor device as claimed in claim 12, further comprising:
a protection layer covering the polysilicon resistive structure and adjacent to the first salicide layer, without overlapping with the polysilicon ring structure.

14. The semiconductor device as claimed in claim 12, further comprising:
a protection layer covering the polysilicon resistive structure and the polysilicon ring structure.

15. The semiconductor device as claimed in claim 12, further comprising:
a second salicide layer covering the polysilicon ring structure; and
a second conductive interconnect structure disposed on the second salicide layer.

16. The semiconductor device as claimed in claim 11, wherein the first direction is a lengthwise direction of the polysilicon resistive structure and the second direction is a widthwise direction of the polysilicon resistive structure.

17. The semiconductor device as claimed in claim 11, further comprising:
a guard ring structure disposed in the active region, encircling the polysilicon ring structure and the polysilicon resistive structure.

18. The semiconductor device as claimed in claim 17, wherein the guard ring structure is parallel to the polysilicon ring structure in a top view.

19. A semiconductor device, comprising:
a semiconductor substrate having an active region and a passive region adjacent to the active region;
dummy polysilicon resistive structures on an isolation structure in the passive region;
a polysilicon resistive structure disposed on the isolation structure, sandwiched between the dummy polysilicon resistive structures along a widthwise direction of the polysilicon resistive structure; and
a polysilicon ring structure disposed on the isolation structure, encircling the polysilicon resistive structure, wherein the dummy polysilicon resistive structures are disposed between the polysilicon ring structure and the polysilicon resistive structure along the widthwise direction of the polysilicon resistive structure, wherein the dummy polysilicon resistive structures are disposed adjacent to opposite sides of the polysilicon resistive structure, wherein the dummy polysilicon resistive structures are electrically floating.

20. The semiconductor device as claimed in claim 19, wherein the dummy polysilicon resistive structures are not disposed between the polysilicon ring structure and the polysilicon resistive structure along a lengthwise direction of the polysilicon resistive structure.

21. The semiconductor device as claimed in claim 19, wherein the polysilicon ring structure encircles the dummy polysilicon resistive structures.

22. The semiconductor device as claimed in claim 19, wherein the polysilicon ring structure is electrically floating.

23. The semiconductor device as claimed in claim 19, further comprising:
   a protection layer covering the polysilicon resistive structure and the dummy polysilicon resistive structures, wherein the polysilicon ring structure is disposed without covered by the protection layer.

24. The semiconductor device as claimed in claim 19, further comprising:
   salicide layers fully covering the polysilicon ring structure, partially covering the polysilicon resistive structure, and partially covering the dummy polysilicon resistive structures.

25. The semiconductor device as claimed in claim 24, further comprising:
   a guard ring structure disposed in the active region, encircling the polysilicon ring structure and the polysilicon resistive structure, wherein the salicide layers cover the guard ring structure.

* * * * *